United States Patent
Akram et al.

(10) Patent No.: US 6,492,738 B2
(45) Date of Patent: *Dec. 10, 2002

(54) APPARATUS AND METHODS OF TESTING AND ASSEMBLING BUMPED DEVICES USING AN ANISOTROPICALLY CONDUCTIVE LAYER

(75) Inventors: Salman Akram, Boise, ID (US); Alan G. Wood, Boise, ID (US); Warren M. Farnworth, Nampa, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,862

(22) Filed: Sep. 2, 1999

(65) Prior Publication Data

US 2002/0043726 A1 Apr. 18, 2002

(51) Int. Cl.⁷ .............................................. H01L 23/48
(52) U.S. Cl. ........................ 257/783; 257/737; 257/783
(58) Field of Search ............................... 257/737, 738, 257/778, 780, 783

(56) References Cited

U.S. PATENT DOCUMENTS

| | | | | |
|---|---|---|---|---|
| 4,857,482 A | * | 8/1989 | Saito et al. .................. | 437/209 |
| 5,001,542 A | * | 3/1991 | Tsukagoshi et al. .......... | 357/68 |
| 5,136,365 A | * | 8/1992 | Pennisi et al. ................. | 357/72 |
| 5,789,278 A | * | 8/1998 | Akram et al. ................ | 438/118 |
| 6,002,180 A | * | 12/1999 | Akram et al. ................ | 257/783 |
| 6,037,786 A | * | 3/2000 | Palagonia .................... | 324/754 |
| 6,121,689 A | * | 9/2000 | Capote et al. ............... | 257/783 |
| 6,150,717 A | * | 11/2000 | Wood et al. ................. | 257/738 |
| 6,153,939 A | * | 11/2000 | Wang et al. ................. | 257/778 |
| 6,188,232 B1 | * | 2/2001 | Akram et al. ................ | 324/755 |
| 6,259,159 B1 | * | 7/2001 | Delal et al. .................. | 257/738 |

* cited by examiner

Primary Examiner—Jerome Jackson, Jr.
Assistant Examiner—Lourdes Cruz
(74) Attorney, Agent, or Firm—Dorsey & Whitney LLP

(57) ABSTRACT

The present invention is directed toward apparatus and methods of testing and assembling bumped die and bumped devices using an anisotropically conductive layer. In one embodiment, a semiconductor device comprises a bumped device having a plurality of conductive bumps formed thereon, a substrate having a plurality of contact pads distributed thereon and approximately aligned with the plurality of conductive bumps, and an anisotropically conductive layer disposed between and mechanically coupled to the bumped device and to the substrate. The anisotropically conductive layer electrically couples each of the conductive bumps with a corresponding one of the contact pads. In another embodiment, an apparatus for testing a bumped device having a plurality of conductive bumps includes a substrate having a plurality of contact pads distributed thereon and substantially alignable with the plurality of conductive bumps, and an anisotropically conductive layer disposed on the first surface and engageable with the plurality of conductive bumps to electrically couple each of the conductive bumps with a corresponding one of the contact pads. Alternately, the test apparatus may also include an alignment device or a bumped device handler. In another embodiment, a method of testing a bumped device includes engaging a plurality of contact pads with an anisotropically conductive layer, engaging the plurality of conductive bumps with the anisotropically conductive layer substantially opposite from and in approximate alignment with the plurality of contact pads, forming a plurality of conductive paths through the anisotropically conductive layer so that each of the conductive bumps is electrically coupled to one of the contact pads, and applying test signals through at least some of the contact pads and the conductive paths to at least some of the conductive bumps.

13 Claims, 4 Drawing Sheets

APPARATUS AND METHODS OF TESTING AND ASSEMBLING BUMPED DEVICES USING AN ANISOTROPICALLY CONDUCTIVE LAYER

TECHNICAL FIELD

The present invention relates to apparatus and methods of testing and assembling bumped die and bumped devices using an anisotropically conductive layer, suitable for testing, for example, flip chip die, chip scale packages, multi-chip modules, and the like.

BACKGROUND OF THE INVENTION

Bumped die and other bumped devices are widely used throughout the electronics industry. As the drive toward smaller electronics continues, the pitch (or spacing) of solder bumps on such bumped devices continues to decrease. The increasingly finer pitches of the solder bumps on bumped die and bumped devices raise concerns about the reliability of these devices. These concerns are being addressed by testing.

A die (or chip) is typically tested during the manufacturing process to ensure that the die conforms to operational specifications. Solder bumps (or balls) are then formed on bond pads of the die using a solder deposition device, such as a solder ball bumper. The solder bumps are typically formed with a height of from 25 μm to 75 μm. The bumped die are then tested by placing conductive test leads in contact with the solder bumps on the die, applying a test signal to the bumps via the test leads, and determining whether the bumped die responds with the proper output signals. If the bumped die tests successfully, it may be installed on a printed circuit board, a chip scale package, a semiconductor module, or other electronics device.

FIG. 1 is a cross-sectional view of a bumped die 10 engaged with a test carrier 20 in accordance with the prior art. In this typical arrangement, the bumped die 10 includes a substrate 12 with a plurality of bond pads 14 thereon. A solder bump 16 (or other suitable conductive material) is formed on each of the bond pads 14. The test carrier 20 has a plurality of contact pads 22 thereon, each of the contact pads 22 being electrically coupled with a test lead 24. For testing of the bumped die 10, the solder bumps 16 engage the contact pads 22 of the test carrier 20, and the appropriate test signals are applied to the bumped die 10 through some of the test leads 24. Output signals from the bumped die 10 are monitored through other test leads 24 to determine whether the bumped die 10 is functioning to specifications. Test carrier apparatus of the type shown in FIG. 1 for testing unpackaged die are described in U.S. Pat. No. 5,519,332 to Wood et. al., incorporated herein by reference.

Testing of the bumped die 10 generally includes four levels of testing. A first or "standard probe" level includes the standard tests for gross functionality of die circuitry. A second or "speed probe" level includes testing the speed performance of the die for the fastest speed grades. A third or "burn-in die" level involves thermal cycling tests intended to drive contaminants into the active circuitry and to detect early failures. And a fourth or "known good die (KGD)" level includes testing to provide a reliability suitable for final products.

To ensure proper transmission of the test signals and output signals, the solder bumps 16 may be temporarily connected with the contact pads 22 by reflowing the bumps, thereby soldering the bumps to the contact pads. After the testing is complete, the solder bumps 16 may be reflowed to disconnect the bumps from the contact pads. Connecting and disconnecting the solder bumps 16 from the contact pads 22, however, involve time consuming processes and may damage the solder bumps 16 or the contact pads 22.

Another problem with soldering the solder bumps 16 to the contact pads 22 is that the coefficient of thermal expansion (CTE) of the bumped die 10 may be appreciably different from the CTE of the test carrier 20. During burn-in die testing, the bumped die 10 and test carrier 20 are placed in a burn-in oven and subjected to temperature cycling (e.g. −55° C. to 150° C.) for a time period of from several minutes to several hours or more. Due to the different CTE of the bumped die 10 and the test carrier 20 and the rigidity of the solder connections, significant stresses may develop throughout the components. These stresses may result in delamination or other damage to the bumped die 16 or the test carrier 20, and may degrade or damage the connection between the solder bumps 16 and the bond pads 14.

An alternate approach to soldering is to simply compress the solder bumps 16 into engagement with the contact pads 22. Ideally, only a small compression force is needed to engage the solder balls 16 against the contact pads 22 so that tests may be conducted. Methods and apparatus for testing die in this manner are fully described in U.S. Pat. No. 5,634,267 to Farnworth and Wood, incorporated herein by reference. The applied compression force, however, must be kept to a minimum because larger forces may damage the circuitry of the bumped die 10 or the test carrier 20.

A problem common to both the solder reflow and the compression force methods of engagement is that the solder bumps 16 are not uniformly shaped. As shown in FIG. 1, the solder bumps 16 are usually of different heights. Using typical manufacturing methods and solders, the nominal variation between the tallest and shortest bumps (shown as a distance d on FIG. 1) is presently about 10% of the average solder ball height. Therefore, when the bumped die 10 is placed on the test carrier 20, the shorter solder bumps may not touch the corresponding contact pads. In some cases, especially for very fine pitch solder bumps, the gaps between the shorter solder bumps and the contact pads may be too large to overcome using solder reflow (because of the small volume of solder in each bump) or by using compression force (because of possible damage to the bumped die).

The variation in solder bump height also creates uncertainty in the final assembly of electronics components that include bumped devices. As the number of bumps on the bumped device increases, the failure rate of the assembled package increases due to solder bump non-uniformity.

FIG. 2 is a partial cross-sectional view of the bumped die 10 of FIG. 1 engaged with another conventional test carrier 40. The test carrier 40 includes a test substrate 42 having a plurality of pockets 44 disposed therein. As shown in FIG. 2, the pockets 44 have sloping sidewalls 46, and a pair of contact blades 48 project from opposing sidewalls 46 into each pocket 44. Conductive test leads 50 are formed on the test substrate 42, including on the sidewalls 46 and contact blades 48 of the pockets 44.

During testing, the solder bumps 16 at least partially engage the pockets 44 of the test carrier 40 with the sharp contact blades 48 partially penetrating the solder bumps 16. The solder bumps 16 may also contact the sloping sidewalls 46 of the test carrier 40. Thus, the desired electrical connection between the solder bumps 16 and the test leads 50 may be achieved despite the variation in the solder bump height.

Although the test carrier 40 having pockets 44 with contact blades 48 addresses solder bump height variation, testing solder bumps with the test carrier 40 has several disadvantages. For example, because the contact blades 48 penetrate the solder bumps 16, the solder bumps may be cracked, chipped, or otherwise damaged by the contact blades. The solder bumps 16 may also become stuck to the contact blades 48, requiring additional time and effort to disengage the bumped die 10 from the test carrier 40. Furthermore, the test carrier 40 with the plurality of pockets 44 is relatively costly to fabricate and more difficult to maintain than alternative test carriers having flat contact pads.

FIG. 3 is a partial cross-sectional view of the bumped die 10 of FIG. 1 engaged with another prior art test carrier 60. In this example, the test carrier 60 includes a test substrate 62 having a plurality of pedestals 64 formed thereon. Test leads 66 are disposed on the test substrate 62, each test lead 66 terminating in a contact pad 68 on the top of each pedestal 64. A plurality of projections 69 project from each contact pad 68. Apparatus for testing semiconductor circuitry of the type shown in FIG. 3 are more fully described in U.S. Pat. No. 5,326,428 to Famworth et. aL, U.S. Pat. No. 5,419,807 to Akram and Famworth, and U.S. Pat. No. 5,483,741 to Akram et. al., which are incorporated herein by reference.

To conduct a test of the bumped die 10, the solder bumps 16 engage the contact pads 68 so that the sharp projections 69 at least partially penetrate the solder bumps 16. The projections 69 may be properly sized to penetrate into the taller solder bumps, allowing the shorter solder bumps to at least contact the projections of the corresponding contact pad 68.

One of the drawbacks of testing bumped die using the carrier 60 having projections 69 is that the projections (like the contact blades 48 described above) may damage the solder bumps 16. Furthermore, the projections 69 are relatively expensive to manufacture, particularly when the projections must be sized to account for a nominal 10% variation in the solder bump height.

SUMMARY OF THE INVENTION

The present invention is directed toward apparatus and methods of testing and assembling bumped devices using anisotropically conductive layers. In one aspect of the invention, a semiconductor device comprises a bumped device having a plurality of conductive bumps formed thereon, a substrate having a plurality of contact pads distributed thereon and approximately aligned with the plurality of conductive bumps, and an anisotropically conductive layer disposed between and mechanically coupled to the bumped device and to the substrate. The anisotropically conductive layer electrically couples each of the conductive bumps with a corresponding one of the contact pads, providing electrical contact between the conductive bumps and the contact pads despite variation in conductive bump height, and without damaging the conductive bumps.

In another aspect, an apparatus for testing a bumped device having a plurality of conductive bumps includes a substrate having a plurality of contact pads distributed thereon and substantially alignable with the plurality of conductive bumps, and an anisotropically conductive layer disposed on the first surface and engageable with the plurality of conductive bumps to electrically couple each of the conductive bumps with a corresponding one of the contact pads. Alternately, the test apparatus may also include an alignment device. In another aspect, the test apparatus may include a bumped device handler. The test apparatus provides for rapid and efficient engagement, testing, and disengagement of the bumped device.

In another aspect of the invention, a method of forming a semiconductor device includes providing a bumped device having a plurality of conductive bumps formed thereon, providing a substrate having a plurality of contact pads distributed thereon, forming an anisotropically conductive layer between the conductive bumps and the contact pads, approximately aligning the plurality of conductive bumps with the plurality of contact pads, and engaging the plurality of conductive bumps and the plurality of contact pads with the anisotropically conductive layer to electrically couple each of the conductive bumps with a corresponding one of the contact pads.

In yet another aspect of the invention, a method of testing a bumped device includes engaging a plurality of contact pads with an anisotropically conductive layer, engaging the plurality of conductive bumps with the anisotropically conductive layer substantially opposite from and in approximate alignment with the plurality of contact pads, forming a plurality of conductive paths through the anisotropically conductive layer so that each of the conductive bumps is electrically coupled to one of the contact pads, and applying test signals through at least some of the contact pads and the conductive paths to at least some of the conductive bumps. Alternately, the method further includes at least partially curing the anisotropically conductive layer. The method advantageously reduces the time, effort and expense involved in connecting and disconnecting the conductive bumps from the contact pads, reduces the potential for damage to the conductive bumps or the contact pads, and accommodates variation in the heights of the conductive bumps.

DETAILED DESCRIPTION OF THE INVENTION

The following description is generally directed toward apparatus and methods of testing and assembling bumped die and bumped devices using anisotropically conductive layers. Many specific details of certain embodiments of the invention are set forth in the following description and in FIGS. 2–7 to provide a thorough understanding of such embodiments. One skilled in the art, however, will understand that the present invention may have additional embodiments, or that the present invention may be practiced without several of the details described in the following description.

Throughout the following discussion, apparatus and methods in accordance with the invention are described in relation to the testing and assembly of bumped die. It is understood, however, that the inventive apparatus and methods may be used to test and assemble any number of bumped devices, including chip scale packages, chip modules, or any other bumped devices. To simplify the following discussion, however, the inventive apparatus and methods are described in relation to testing and assembly of bumped die with a test carrier or a printed circuit board, allowing the reader to focus on the inventive aspects.

Figure 1:
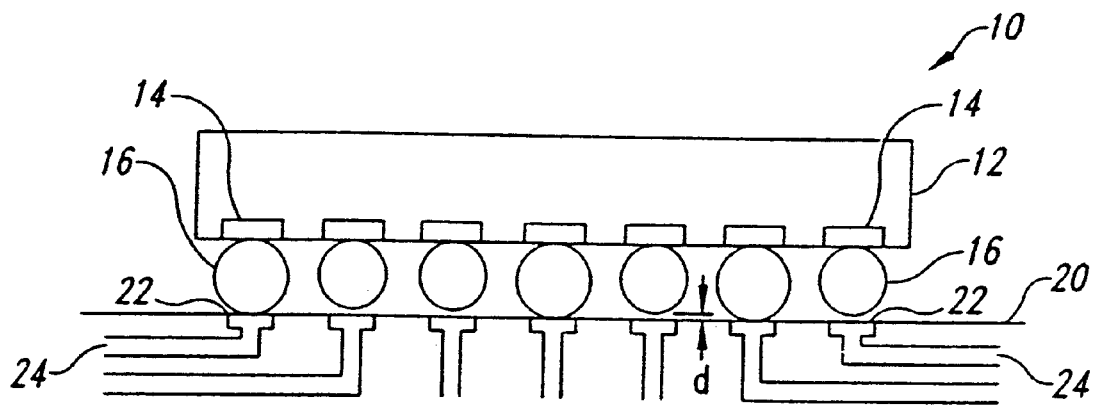
FIG. 1 is a cross-sectional view of a bumped die engaged with a test carrier in accordance with the prior art.
Figure 4:
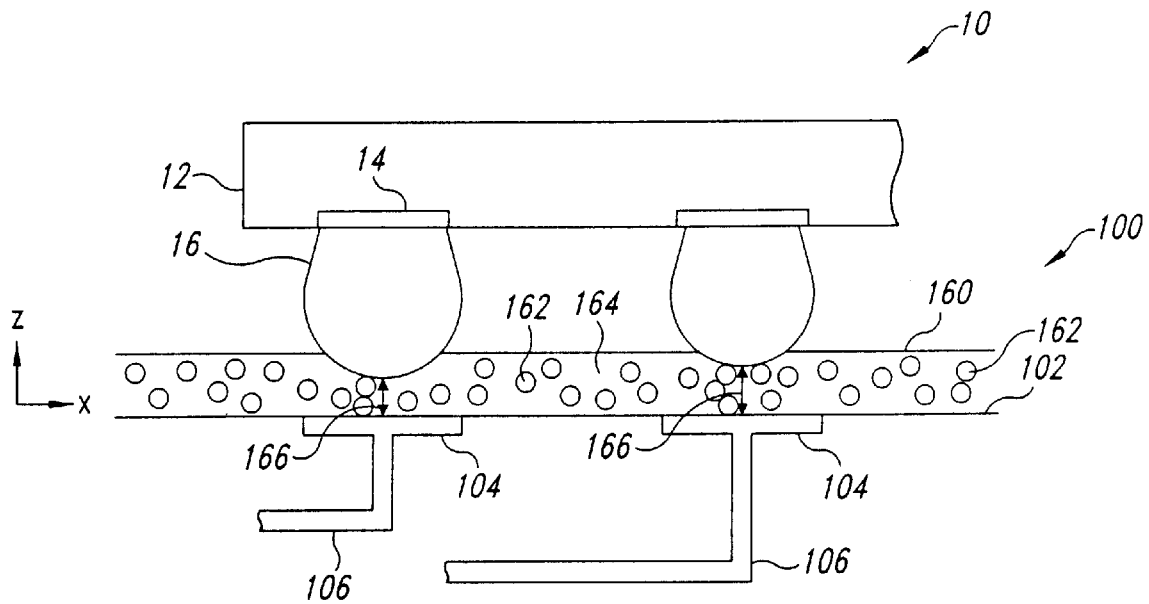
FIG. 4 is a partial cross-sectional view of the bumped die of FIG. 1 engaged with a test carrier in accordance with an embodiment of the invention.

FIG. 4 is a partial cross-sectional view of the bumped die 10 of FIG. 1 engaged with a test carrier 100 in accordance with an embodiment of the invention. In this embodiment, the test carrier 100 includes a test substrate 102 having a plurality of contact pads 104 coupled with a plurality of test leads 106. An anisotropically conductive layer 160 having conductive particles 162 distributed in a suspension material 164 is formed on the test substrate 102 and contact pads 104.

The anisotropically conductive layer 160 is formed such that electrical resistance in one direction through the layer 160 differs from that measured in the other directions. Typically, electrical conductivity is provided in one direction (e.g. the "z" direction) while high resistance is provided in all other directions. The conductivity in the one direction may be pressure sensitive, requiring that the material be compressed in that direction to achieve the desired conductivity.

One type of anisotropically conductive material suitable for forming the anisotropically conductive layer 160 is known as a "z-axis anisotropic adhesive." In the z-axis anisotropic adhesive, the conductive particles 162 are distributed to a low level such that the particles do not contact each other in the xy plane. Compression of the layer 160 in the z direction, however, causes the conductive particles 162 to contact each other in the z direction, establishing an electrically conductive path. The conductive particles 162 may be formed from any suitable electrically conductive materials, such as gold, silver, or other electrically conductive elements or compounds. Similarly, the suspension material 164 may be include, for example, a thermoset polymer, a B-stage (or "pre-preg") polymer, a pre-B stage polymer, a thermoplastic polymer, or any monomer, polymer, or other suitable material that can support the electrically conductive particles 162.

Z-axis anisotropic adhesives may be formed in a number of ways, including, for example, as a film or as a viscous paste that is applied (e.g. stenciled, sprayed, flowed, etc.) to the contact pads 104. The anisotropically conductive adhesives may then be cured. Curing may be performed in a variety of ways, such as by subjecting the materials to certain environmental conditions (e.g. temperature, pressure, etc.), or by the removal of solvents or suitable curing compounds, or by irradiation/exposure to ultraviolet or ultrasonic energy, or by other suitable means.

For example, z-axis anisotropic adhesives are commercially available in both a thermoplastic variety or a thermosetting variety. Thermoplastic anisotropic adhesives are those that are heated to soften for application to the test substrate and then cooled for curing, and include, for example, solvent-based hot-melt glue. Conversely, thermosetting anisotropic adhesives are suitable for application to the test substrate at normal ambient temperatures, and are heated for curing at temperatures from 100° C. to 300° C. for periods from several minutes to an hour or more. Suitable z-axis anisotropic adhesives include those available from A.I. Technology, Inc. of Trenton, N.J., or Sheldahl, Inc. of Northfield, Minnesota, or 3M of St. Paul, Minn.

As best seen in FIG. 4, the anisotropically conductive layer 160 is formed on the test substrate 102, and the bumped die 10 is positioned adjacent to the layer 160 with the solder (or conductive) bumps 16 approximately aligned with the contact pads 104. The bumps 16 may alternately be formed of any suitable, electrically conductive material. For bumped die 10 having solder bump pitches of at least 32 $\mu$m, conventional mechanical alignment devices may be used. For finer pitches, however, more advanced optical alignment systems may be necessary, such as the type of alignment apparatus shown and described in U.S. Pat. No. 4,899,921 to Bendat et. al., incorporated herein by reference.

In the test carrier 100, the solder bumps 16 are compressed into the anisotropically conductive layer 160 prior to the curing of the layer 160 so that the solder bumps 16 become embedded in the layer 160. The compression of the solder bumps 16 into the anisotropically conductive layer 160 compresses the conductive particles 162 into contact with each other and creates an electrically conductive path 166 between each of the solder bumps 16 and its corresponding contact pad 104.

In the test carrier 100, the solder bumps 16 become attached to the test carrier 100 during the curing of the anisotropically conductive layer 160. For example, in one embodiment, an anisotropically conductive layer 160 having a B stage polymer as the suspension material 164 is applied to the test carrier 100. A bumped die 10 is pressed into the layer 160 until the solder bumps 16 are "tacked" in position, and then the bumped die 10 and test carrier 100 are placed in an oven and heated to 150° C. At this temperature, the polymer is fully cross-linked, curing the layer 160 to a hardened consistency.

One or more test signals are then transmitted to the bumped die 10 through one or more of the test leads 106, through the contact pads 104, across the conductive paths 166, through the solder bumps 16, and into the bumped die 10. Output signals from the bumped die 10 are then communicated from the solder bumps 16 back across the conductive paths 166 to the contact pads 104 and other test leads 106, and are monitored to determine whether the bumped die 10 is functioning to the desired specifications.

After testing, the bumped die 10 may be removed from the test carrier 100 by detaching the solder bumps 16 from the anisotropically conductive layer 160. This may be accomplished in a number of ways depending upon the properties of the anisotropically conductive layer 160, including, for example, by heating the layer 160 until it softens, or by applying solvents to dissolve the layer, or by other suitable means. After the bumped die 10 is removed, the test carrier 100 may be used to test another bumped die 10.

Alternately, FIG. 4 may represent a cross-sectional view of the bumped die 10 attached to any electronic component, such as a printed circuit board 100. In that case, the bumped die 10 may be aligned with the contact pads 104 and attached with the anisotropically conductive layer 160 as described above, except that the bumped die 10 is not removed and remains secured to the printed circuit board 100.

Although the anisotropically conductive layer 160 is shown in FIG. 4 as being a single, continuous layer covering the entire test substrate 102, it is not necessary that only one layer be used, or that the layer be continuous. Rather, the anisotropically conductive material may be formed on a plurality of contact pads 104 of the test carrier (or printed circuit board) 100 in a variety of patterns, including, for example, in strips covering rows of contact pads, or in a checkerboard pattern covering regions of contact pads.

Furthermore, it is not necessary that the anisotropically conductive layer 160 be formed on the test carrier (or printed circuit board) 100, but rather, the layer 160 might be formed on the solder bumps 16 of the bumped die 10. After the layer 160 is applied to the solder bumps 16, the test carrier 100 may be engaged with the layer to form the desired electrical connections for testing of the die.

The anisotropically conductive layer 160 advantageously improves the process of testing and assembling of bumped die 10 and other bumped devices. The process of attaching (and detaching) the bumped die 10 to the test carrier (or printed circuit board) 100 using the anisotropically conductive layer 160 may be less time consuming and more economical than the prior art process of soldering (and unsoldering) the solder bumps 16 to (and from) the contact pads 104 because the rework temperatures of the anisotropically conductive layer 160 (typically 80° C. to 150° C.) may be less than the typical reflow temperature of solder (183° C.). Thus, less time and energy may be needed to bring the temperatures of the bumped die 10 and test carrier 100 up to the temperature necessary for detachment, and the potential for damaging the solder bumps 16 or the contact pads 104 may be decreased due to the reduced rework temperatures.

Another advantage of the test carrier (or printed circuit board) 100 having the anisotropically conductive layer 160 is that a more flexible connection may be provided between the solder bumps 16 and the contact pads 22 than is obtained using solder. If the bumped die 10 and test carrier 100 are subjected to a large range of temperatures or repeatedly thermal cycling during the testing (e.g. burn-in tests), the flexibility of the layer 160 may relieve stresses that might otherwise occur due to the differences in the CTE of the bumped die 10 and the test carrier 100. Depending upon the anisotropically conductive materials used, the anisotropically conductive layer 160 may advantageously expand and contract during such testing to prevent delamination or other damage to the bumped die 16 or the test carrier 100, or to prevent damage from occurring at the connection between the solder bumps 16 and the bond pads 14.

An additional advantage of the anisotropically conductive layer 160 is that satisfactory electrical contact may be achieved between the contact pads 104 and the solder bumps 16 despite the variation in the heights of the solder bumps 16. Because the tallest solder bumps 16 become embedded in the layer 160, if the layer 160 is properly sized, even the shortest solder bumps 16 may be brought into contact with the layer 160 to form an electrical path 166 between the solder bumps 16 and the contact pads 104. The anisotropically conductive layer 160 may therefore improve the electrical connection between the short solder bumps and the contact pads.

The anisotropically conductive layer 160 may also reduce the compression force needed to bring the short solder bumps 16 into electrical contact with the contact pads 104. Because the compression force is reduced, the potential for damaging the bumped die 10 or the test carrier (or printed circuit board) 100 is reduced.

Yet another advantage of the anisotropically conductive layer 160 is that the solder bumps 16 of the bumped die 10 may be easily cleaned of any residual amounts of the anisotropically conductive material following testing. Some anisotropically conductive materials are commercially available that are readily dissolvable using solvents for ease of removal and cleanup. One solvent that may be suitable (depending upon the anisotropically conductive material used) is RS 816 available from AI Technology, Inc. of Princeton, N.J. Thus, the time consuming task of flux cleaning associated with traditional soldering may be avoided.

Figure 5:
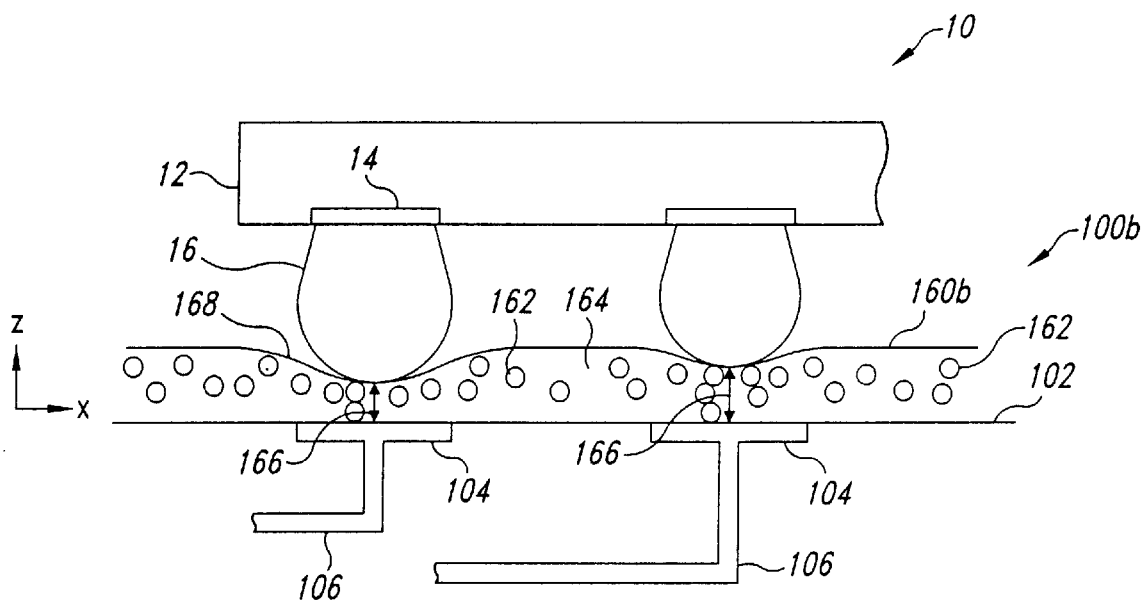
FIG. 5 is a partial cross-sectional view of the bumped die of FIG. 1 engaged with a test carrier in accordance with an alternate embodiment ofthe invention.

FIG. 5 is a partial cross-sectional view of the bumped die 10 of FIG. 1 engaged with a test carrier 100*b* in accordance with an alternate embodiment of the invention. In this embodiment, the test carrier 100*b* includes an anisotropically conductive layer 160*b* that has a flexible outer surface 168. The flexible outer surface 168 may be formed, for example, by at least partially curing the anisotropically conductive layer 160*b* prior to engagement with the bumped die 10. The flexible outer surface 168 may be a resilient surface.

To test the bumped die 10 using the test carrier 100*b*, the die is positioned over the layer 160*b* with the solder bumps 16 approximately aligned with the contact pads 104. The solder bumps 16 are then compressed against the flexible outer surface 168 causing localized compression of the anisotropically conductive material 160*b* in the region near each of the solder bumps 16. The conductive particles 162 are brought into contact by the compression forces to form the conductive paths 166 between each of the solder bumps 16 and the corresponding contact pads 104. Test signals are then transmitted to the bumped die 10 through some of the test leads 104 and the conductive paths 166, and output signals from the bumped die 10 are transmitted from the solder bumps 16 through the conductive paths 166 to the test carrier 100*b* as previously described above.

After the bumped die 10 has been tested, it is disengaged from the test carrier 100*b* by simply moving the solder bumps 16 away from the flexible outer surface 168 of the anisotropically conductive layer 160*b*. If the flexible outer surface 168 of the layer 160*b* is a resilient surface, the localized compression areas near each of the solder bumps 16 will spring back to their uncompressed shape.

The test carrier 100*b* having the layer 160*b* with the flexible outer surface 168 may further improve the process of testing of the bumped die 10 by reducing or eliminating the time and effort involved in detaching the solder bumps 16 from the anisotropically conductive layer 160*b*. Because the solder bumps 16 are not embedded in the layer 160*b*, it is not necessary to reheat the bumped die 10 or the test carrier 100*b* to the rework temperature of the anisotropically conductive layer 160*b* in order to disengage the die from the test carrier. The time, effort, and expense associated with disengaging the solder bumps 16 from the anisotropically conductive layer 160 may therefore be reduced or eliminated.

Similarly, because the solder bumps 16 are not embedded in the anisotropically conductive layer 160*b*, the time, effort, and expense associated with cleanup of any residual anisotropically conductive material deposited on the solder bumps 16 may also be reduced or eliminated. Depending upon the anisotropically conductive material used, the transfer of material to the solder bumps 16 may be minimized or eliminated so that the solder bumps 16 may be clean enough for immediate use after testing.

Figure 6:
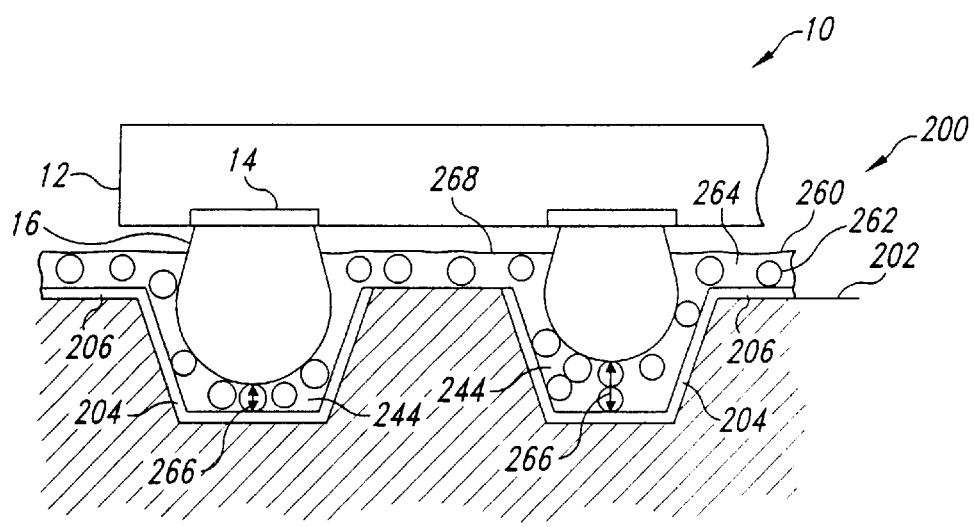
FIG. 6 is a partial cross-sectional view of the bumped die of FIG. 1 engaged with a test carrier in accordance with another alternate embodiment of the invention.

FIG. 6 is a partial cross-sectional view of the bumped die 10 engaged with a test carrier (or printed circuit board) 200 in accordance with another alternate embodiment of the invention. In this embodiment, the test carrier 200 includes a test substrate 202 having a plurality of pockets 244 disposed therein. A plurality of test leads 206 are formed on the test substrate 202, each test lead 206 terminating in a contact pad 204 that is formed within each of the pockets 244. An anisotropically conductive layer 260 is formed on the test substrate (or printed circuit board) 202 covering the contact pads 204 and test leads 206. The anisotropically conductive layer 260 includes a plurality of conductive particles 262 contained with a suspension medium 264, and an outer surface 268.

In operation, the solder bumps 16 of the bumped die 10 are at least partially disposed within the pockets 244 of the test carrier 200. The solder bumps 16 may be embedded in the anisotropically conductive layer 260 prior to the curing of the layer, or alternately, the layer 260 may be at least partially cured so that the outer surface 268 is a flexible surface and the solder bumps 16 do not penetrate the outer surface 268 or become attached to the layer 260. In either case, a compression force may be applied to the bumped die 10 (or to the test carrier 200) to compress the anisotropically conductive material to form a conductive path 266 between each solder bump 16 and each contact pad 204. Testing may then be performed on the bumped die 10. After testing is complete, the bumped die 10 may be disengaged from the test carrier 200 in one of the ways described above. Alternately, in the case of the bumped die 10 being attached to the printed circuit board 200, the bumped die 10 is not disengaged.

Figure 2:
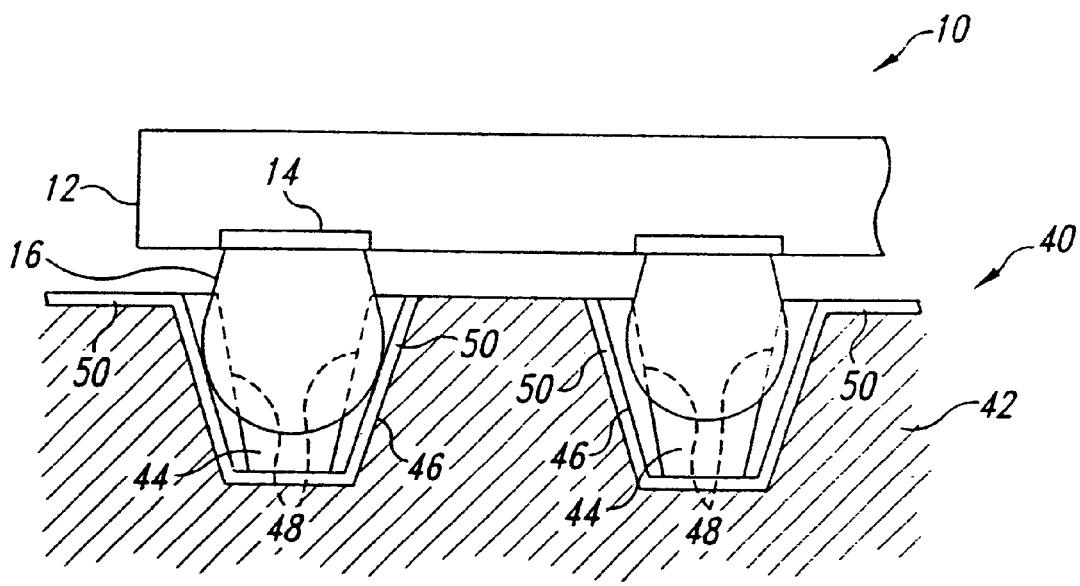
FIG. 2 is a partial cross-sectional view of the bumped die of FIG. 1 engaged with an alternate embodiment of a test carrier in accordance with the prior art.

The test carrier 200 having the pockets 244 and the anisotropically conductive layer 260 further improves the testing of the bumped die 10 by providing the desired electrical contact between the solder bumps 16 and the contact pads 204 without penetration of the solder bumps 16 using contact blades 48 or the like (see FIG. 2). Despite the variability of the size and shape of the solder bumps 16, the anisotropically conductive layer 260 provides the necessary electrical contact along the conductive paths 266 between the solder bumps 16 and the contact pads 104. Because the contact blades 48 may be eliminated, fabrication and maintenance of the test carrier 200 is simplified compared to the prior art test carrier 40 shown in FIG. 2. Also, the potential for the solder bumps 16 to be cracked, chipped, or otherwise damaged due to penetration by the contact blades 48 is eliminated.

Similarly, when the bumped die 10 is engaged with the printed circuit board 200 having pockets 244 and the anisotropically conductive layer 260, the electrical contact between the bumps 16 and the contact pads 204 is improved. As shown in FIG. 6, electrical contact between the solder bumps 16 and the sidewalls 204 is achievable over a larger contact area due to the anisotropically conductive layer 260, providing improved electrical contact compared with the contact blades 48 of the prior art device (FIG. 2). Also, because the contact blades 48 may be eliminated, the manufacturing the pockets 244 is simplified. The pockets 244 may be formed, for example, by masking the areas surrounding the locations of the pockets 244 with a hard mask, and then etching the substrate using an etchant (e.g. KOH).

Figure 7:
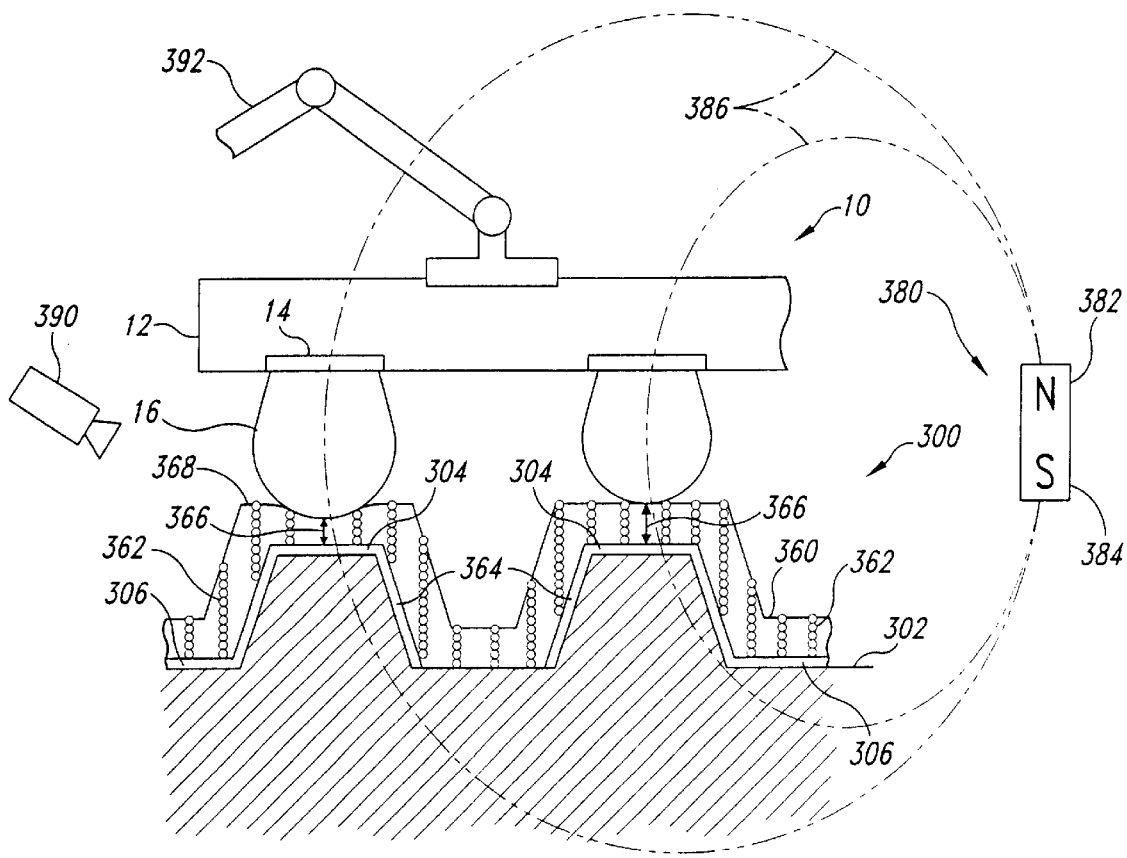
FIG. 7 is a partial cross-sectional view of the bumped die of FIG. 1 engaged with a test carrier in accordance with yet another embodiment of the invention.

FIG. 7 is a partial cross-sectional view of the bumped die 10 engaged with a test carrier (or printed circuit board) 300 in accordance with yet another embodiment of the invention. In this embodiment, the test carrier 300 includes a test substrate 302 having a plurality of pedestals 364 projecting upwardly therefrom. Test leads 306 are formed on the test substrate 302, each test lead 306 terminating in a contact pad 304 formed on at the top of each pedestal 364.

A magnet 380 having a north pole 382 and a south pole 384 is positioned near the test substrate 302. A plurality of magnetic flux lines 386 (only two shown in FIG. 7) emanate from the magnet 380. An anisotropically conductive layer 360 having a plurality of conductive particles 362 and an outer surface 368 is formed on the test substrate 302. An optical alignment system 390 (such as the type of alignment apparatus shown and described in U.S. Pat. No. 4,899,921 to Bendat et. al.) is positioned proximate the solder bumps 16 to ensure the alignment of the solder bumps 16 with the contact pads 304. A die handler 392 is engaged with and controllably positions the bumped die 10. Numerous types of die handlers 392 are suitable for this purpose, including, for example, those shown and described in U.S. Pat. No. 5,184,068 to Twigg et. al., U.S. Pat. No. 5,828,223 to Rabkin et. al., and the IC handlers available from Verilogic Corporation of Denver, Colo.

During the formation of the anisotropically conductive layer 360, the conductive particles 362 align with the magnetic flux lines 386 to form conductive columns along the flux lines which form a conductive path 366 between each solder bump and its corresponding contact pad. If the magnetic flux lines 386 are strong enough, some of the conductive particles 362 may be induced to protrude from the surface 368 of the layer 360 (as shown in FIG. 7). Suitable anisotropically conductive materials that form conductive paths 366 when exposed to a magnetic field include, for example, the Elastomeric Conductive Polymer Interconnect (ECPI) materials available from AT&T Bell Laboratories of Murray Hill, New Jersey. For testing of the bumped die 10, the solder bumps 16 may either be embedded in the anisotropically conductive layer 360 prior to the curing of the layer, or alternately, the layer 360 may be at least partially cured so that an outer surface is a flexible surface that is not penetrated by the solder bumps 16. In either case, the solder bumps 16 are engaged with the anisotropically conductive layer 360 using the die handler 392 and the optical alignment system 390 so that each of the solder bumps 16 are electrically coupled to a corresponding one of the contacts pads 304 by at least one of the conductive paths 366. Testing may then be performed on the bumped die 10, and the bumped die 10 may be disengaged from the test carrier 300 in one of the ways described above.

Figure 3:
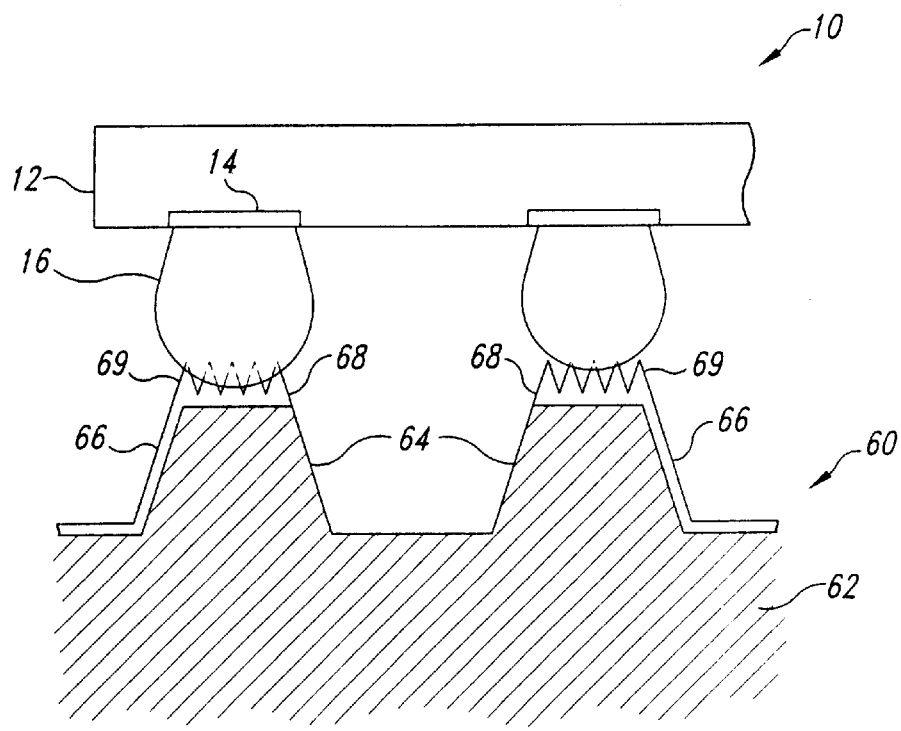
FIG. 3 is a partial cross-sectional view of the bumped die of FIG. 1 engaged with another embodiment of a test carrier in accordance with the prior art.

An advantage of the test carrier 300 having the pedestals 364 and the anisotropically conductive layer 360 is that the desired electrical contact between the solder bumps 16 and the contact pads 304 is provided without penetration of the solder bumps 16 using the projections 69 (see FIG. 3). Because the projections 69 may be eliminated, fabrication of the test carrier (or printed circuit board) 300 is simplified compared to the prior art test carrier 60 shown in FIG. 3. Also, the potential for the solder bumps 16 to be cracked, chipped, or otherwise damaged due to penetration by the projections 69 is eliminated.

Another advantage is that the bumped device 10 may be engaged with the test carrier 300, tested, and disengaged rapidly and efficiently. The anisotropically conductive layer 360 eliminates the time and expense associated with reflowing the solder bumps 16, and provides the desired electrical contact despite variation in the heights of the solder bumps 16.

Although the above described embodiments of the anisotropically conductive layers have been described with specific reference to anisotropically conductive materials that form electrically conductive paths when subjected to a compression force, some anisotropically conductive materials do not require a compression force to form conductive paths. For such materials, the desired electrical contact between the solder bumps and the contact pads of the test carrier may be formed without applying a compression force.

Suitable anisotropically conductive materials that do not require a compression force to form conductive paths include, for example, Elastomeric Conductive Polymer Interconnect (ECPI) materials available from AT&T Bell Laboratories of Murray Hill, N.J. Conductive paths are formed in AT&T Bell's ECPI materials by subjecting the materials to a magnetic field.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part with prior art apparatus and methods to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods of testing and assembling bumped devices using anisotropically conductive layers, and not just to the apparatus and methods described above and shown in the figures. In general, in the following claims, the terms used should not be construed to limit the invention to the specific embodiments disclosed in the specification and the claims, but should be construed to include all apparatus and methods of testing and assembling bumped devices using anisotropically conductive layers that operate within the broad scope of the claims. Accordingly, the invention is not limited by the foregoing disclosure, but instead its scope is to be determined by the following claims.

What is claimed is:

1. A semiconductor device, comprising:
    a bumped device having a plurality of conductive bumps formed thereon;
    a substrate having a plurality of substantially flat contact pads distributed thereon and approximately aligned with the plurality of conductive bumps; and
    an anisotropically conductive layer disposed between the bumped device and the substrate and mechanically coupled to the substrate, the anisotropically conductive layer having a flexible outer surface in contact with the plurality of conductive bumps, the conductive bumps not being embedded within the anisotropically conductive layer, the conductive bumps compressing the flexible outer surface without penetrating the flexible outer surface to form a compression area at each of the conductive bumps and to electrically couple each of the conductive bumps with a corresponding one of the contact pads.

2. The semiconductor device of claim 1 wherein the bumped device comprises a bumped die having a plurality of solder bumps formed thereon.

3. The semiconductor device of claim 1 wherein the anisotropically conductive layer comprises a thermosetting anisotropically conductive adhesive.

4. The semiconductor device of claim 1 wherein the anisotropically conductive layer comprises a thermoplastic anisotropically conductive adhesive.

5. The semiconductor device of claim 1 wherein the anisotropically conductive layer comprises a suspension material having a plurality of conductive particles.

6. The semiconductor device of claim 5 wherein at least some of the conductive particles are engaged into contact to form a conductive path between each conductive bump and the corresponding one contact pad.

7. An apparatus for testing a bumped device having a plurality of conductive bumps, comprising:
    a substrate including a first surface having a plurality of substantially flat contact pads distributed thereon, the contact pads being substantially alignable with the plurality of conductive bumps; and
    an anisotropically conductive layer disposed on the first surface and having a flexible outer surface engageable with the plurality of conductive bumps, the conductive bumps not being embedded within the flexible outer surface, the conductive bumps compressing the flexible outer surface without penetrating the flexible outer surface to form a compression area at each of the conductive bumps and to electrically couple each of the conductive bumps with a corresponding one of the contact pads.

8. The apparatus of claim 7 wherein the flexible outer surface comprises a resilient outer surface engageable with the plurality of conductive bumps.

9. The apparatus of claim 7 wherein the anisotropically conductive layer comprises an anisotropically conductive paste.

10. The apparatus of claim 7, further comprising an alignment device engageable with the bumped device to approximately align the conductive bumps with the contact pads.

11. The apparatus of claim 10 wherein the alignment device comprises an optical alignment device.

12. The apparatus of claim 7, further comprising a bumped device handler engageable with the bumped device for controllably positioning the bumped device into engagement with the anisotropically conductive layer.

13. The semiconductor device of claim 1 wherein the flexible outer surface comprises a resilient outer surface.

* * * * *